US007464353B2

(12) United States Patent  (10) Patent No.: US 7,464,353 B2
Lim  (45) Date of Patent: Dec. 9, 2008

(54) METHOD AND APPARATUS FOR GENERATING TECHNOLOGY INDEPENDENT DELAYS

(75) Inventor: Ricardo Te Lim, Richmond (CA)

(73) Assignee: Seiko Epson Corporation, Tokyo (JP)

( * ) Notice: Subject to any disclaimer, the term of this patent is extended or adjusted under 35 U.S.C. 154(b) by 391 days.

(21) Appl. No.: 11/293,000

(22) Filed: Dec. 2, 2005

(65) Prior Publication Data

US 2007/0130556 A1 Jun. 7, 2007

(51) Int. Cl.
*G06F 17/50* (2006.01)
(52) U.S. Cl. ............................................. 716/6; 716/18
(58) Field of Classification Search ................. 716/1–2, 716/6, 18; 703/14–15; 714/731
See application file for complete search history.

(56) References Cited

U.S. PATENT DOCUMENTS

| 4,107,664 | A | * | 8/1978 | Marino ........................ 345/20 |
| 4,588,944 | A | * | 5/1986 | Rothenberger .............. 714/731 |
| 5,003,487 | A |   | 3/1991 | Drumm et al. |
| 5,500,808 | A |   | 3/1996 | Wang |
| 5,625,565 | A | * | 4/1997 | Van Dyke ...................... 716/1 |
| 5,654,898 | A |   | 8/1997 | Roetcisoender et al. |
| 5,661,661 | A |   | 8/1997 | Gregory et al. |
| 5,974,245 | A |   | 10/1999 | Li et al. |
| 6,434,733 | B1 |  | 8/2002 | Duggirala et al. |
| 6,438,731 | B1 |  | 8/2002 | Segal |
| 6,438,735 | B1 |  | 8/2002 | McElvain et al. |
| 6,463,567 | B1 |  | 10/2002 | Kozai |
| 6,519,754 | B1 |  | 2/2003 | McElvain et al. |
| 6,543,037 | B1 |  | 4/2003 | Limqueco et al. |
| 6,634,014 | B1 |  | 10/2003 | Lindberg et al. |
| 6,668,364 | B2 |  | 12/2003 | McElvain et al. |
| 6,672,776 | B1 |  | 1/2004 | Limqueco et al. |
| 2001/0028686 | A1 | * | 10/2001 | Richards ...................... 375/289 |
| 2003/0125918 | A1 | * | 7/2003 | Rich et al. .................... 703/14 |
| 2003/0126569 | A1 |   | 7/2003 | Rich et al. |

OTHER PUBLICATIONS

'Strategies for Development and Modelling of VHDL Based Macrocell Library', Juha Nousiainen, Arto Nummela, Jari Nurmi and Hannu Tenhunen, Tampere University of Technology, Signal Processing Laboratory, Finland, The Royal Institute of Technology, Institute of Electronic System Design, Sweden, 1993 IEEE, (pp. 478-482).
'A VHDL based Functional Compiler for Optimum Architecture Generation of FIR filters', Varun Verma and Charles Chien, Integrated Circuits and Systems Laboratory, Electrical Engineering Department, University of California, Los Angeles, 1996 IEEE, (pp. 564-567).
'A Technology Independent Approach to Hierarchical IC Layout Extraction', Ahsan Bootehsaz and Robert A. Cottrell, Department of Electrical Engineering and Electronics, University of Manchester Institute of Science and Technology, Manchester, England, 1986 IEEE, (pp. 425-431).

* cited by examiner

*Primary Examiner*—Paul Dinh
(74) *Attorney, Agent, or Firm*—Mark P. Watson

(57) ABSTRACT

A method for generating an integrated circuit (IC) is provided wherein signal delays are transferable across two synthesis libraries where each library is associated with a different IC fabrication process. The method initiates with describing an IC design through a hardware description language (HDL). The method includes identifying logic signal delay points within the HDL. Then, technology-independent logic signal delay code is inserted within the delay points of the HDL representation. A system for designing an IC is also provided.

11 Claims, 5 Drawing Sheets

METHOD AND APPARATUS FOR GENERATING TECHNOLOGY INDEPENDENT DELAYS

BACKGROUND

Integrated circuits are often designed on computer systems with design tools using hardware description languages (HDL). Examples of HDL include Verilog and VHDL. During the circuit design process, timing analysis of the circuit frequently identifies points in the circuit design where logic signal delays need to be implanted for the circuit to function properly.

Currently, logic signal delays are hand-coded using delay gates of a synthesis library that is used with a HDL design tool. Broadly speaking, a synthesis library is a software library describing logic gates in a manner closely associated with a fabrication process technology. Fabrication process technology or the more commonly used expression "process technology" is a term of art encompassing the various processes for manufacturing an integrated circuit and is usually associated with the average feature size of the integrated circuit that can be manufactured. An example of a fabrication process technology is 0.13 micron technology.

If it is desirable to transfer an IC design to a smaller fabrication process technology, a synthesis library associated with the smaller fabrication process technology must be used with an HDL design tool. Because the smaller fabrication process technology differs from when the circuit was originally designed, logic signal delay requirements between logic gates will also be different from the original circuit design. Consequently, logic signal delays must be redesigned and implanted into the IC design for the circuit to function properly with the smaller fabrication process technology.

The process of redesigning logic signal delays can be time consuming and is prone to human error. Therefore a method is required for generating logic signal delays in an integrated circuit design which automatically adjusts when the integrated circuit design is transferred across synthesis libraries incorporating different IC fabrication process sizes.

SUMMARY

Broadly speaking, the present invention fills this need by providing a method for generating logic signal delays in an integrated circuit design which automatically adjusts when the integrated circuit design is transferred across synthesis libraries. It should be appreciated that the present invention can be implemented in numerous ways, including as a method, a system, or a device. Several inventive embodiments of the present invention are described below.

In accordance with one embodiment of the invention, a method for generating an integrated circuit (IC) is provided wherein signal delays are transferable across two synthesis libraries where each library is associated with a different IC fabrication process. The method initiates with describing an IC design through a hardware description language (HDL). The method includes identifying logic signal delay points within the HDL. Then, technology-independent logic signal delay code is inserted within the delay points of the HDL representation.

In accordance with another embodiment of the invention, a method for transferring IC designs across synthesis libraries is provided. The method initiates with describing an IC design through an HDL. The method includes identifying logic signal delay points within the HDL. Then, the HDL representation is synthesized using the logic gates associated with a first technology library. The synthesizing includes technology-independent logic signal delay code being inserted within the delay points of the HDL representation. After this is accomplished, the HDL representation is synthesized with a second technology library wherein the second technology library has a different delay through the logic gates. The logic delay signal associated with the second technology library is automatically adjusted from the logic delay signal associated with the first technology library.

In accordance with yet another embodiment of the invention, a system for designing an IC is provided. The system includes a bus, a memory, and a processor in communication with the memory through the bus. The processor is operable to execute instructions which allow the system to generate an IC design through an HDL representation, identify logic signal delay points in the HDL representation, and insert technology-independent logic signal delay code within the delay points of the HDL representation.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

The present invention is directed to integrated circuit design using HDL. Flip-flops are used instead of logic delay gates to generate logic signal delays for an IC design. Consequently, the logic signal delays do not need to be redesigned if the IC design is transferred to a smaller fabrication process technology.

Figure 1:
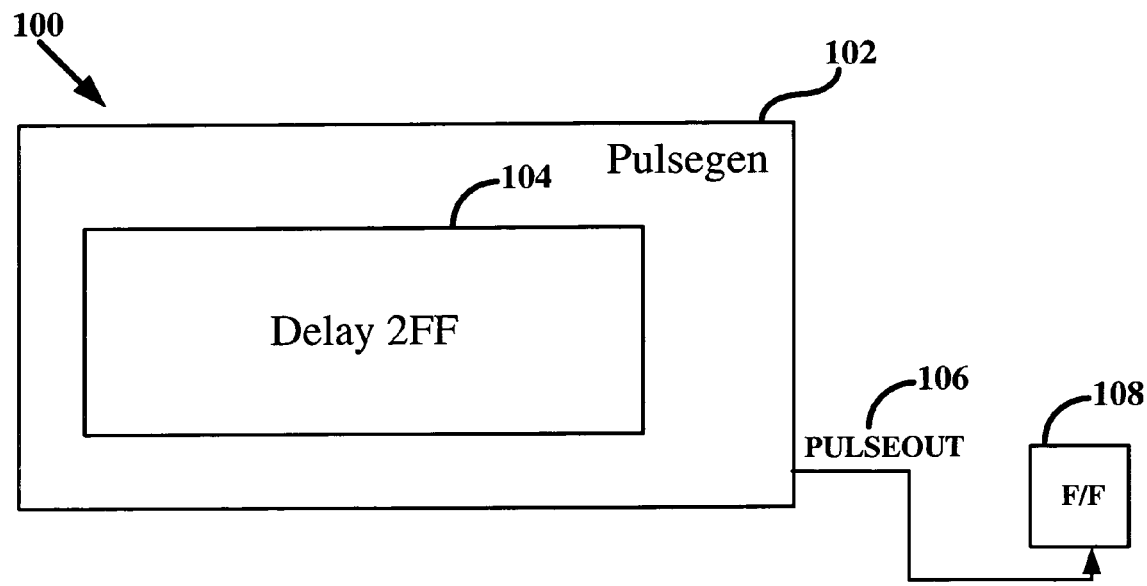
FIG. 1 is a conceptual diagram illustrating the modules for generating logic signal delays in accordance with one embodiment of the invention.

FIG. 1 is a conceptual diagram illustrating the modules for generating logic signal delays in accordance with one embodiment of the invention. HDL software code 100 generates PULSEOUT signal 106 which is input into logic gate 108. PULSEOUT signal 106 is a logic signal delay designed to meet the timing requirements of logic gate 108. Although logic gate 108 is illustrated as a flip-flop, it is understood that logic gate 108 may be any logic gate requiring a logic signal delay. HDL software code 100 includes Delay 2FF module 104 describing at least two flip-flops in combination to create a logic signal delay. Pulsegen module 102, which instantiates both Delay 2FF module 104 and PULSEOUT signal 106, is also included.

Figure 2:
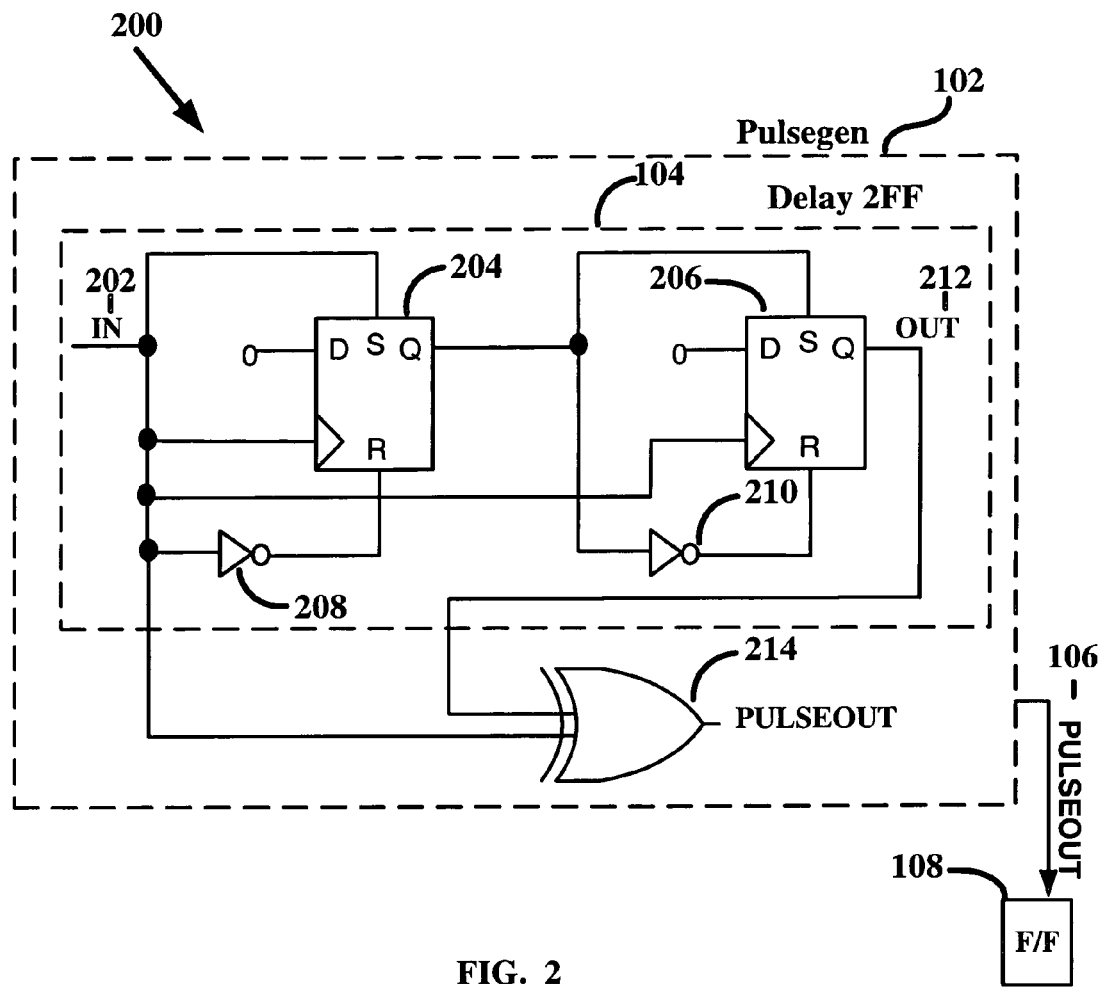
FIG. 2 is a diagram illustrating in greater detail the modules for generating logic signal delays in accordance with one embodiment of the invention.

FIG. 2 is a diagram illustrating in greater detail the modules for generating logic signal delays in accordance with one embodiment of the invention. Delay 2FF module 104 comprises IN signal 202, first flip-flop 204, second flip-flop 206, a first inverter 208, a second inverter 210 and an OUT signal 212. The D input of first flip-flop 204 and the D input of second flip-flop 206 are tied to a 0 logic signal. The S and Clk inputs of first flip-flop 204 and the Clk input of second flip-flop 206 are connected to IN signal 202. First inverter 208 is connected to IN signal 202 and inverts IN signal 202 into the R input of first flip-flop 204. The S input of second flip-flop 206 is tied to the Q output of first flip-flop 204. Second inverter 210 is tied to the Q output of first flip-flop 204 and inverts the Q output of first flip-flop 204 into the R input of second flip-flop 206. The Q output of second flip-flop forms OUT signal 212.

Still referring to FIG. 2, within Pulsegen module 102, Delay 2FF module 104 and XOR gate 214 are illustrated. XOR gate 214 has two input nodes and has one output node. One input node of XOR gate 214 is connected to IN signal 202 while the second input node of XOR gate 214 is connected to OUT signal 212. The logical combination of the input nodes of XOR gate 214 forms, at the output node of XOR gate 214, PULSEOUT signal 106. PULSEOUT signal 106 is a logic signal delay designed to meet the timing requirements of logic gate 108. Table 1 illustrates an exemplary HDL sequence to generate a logic signal delay in accordance with one embodiment of the invention.

TABLE 1

```
module delay2FF(IN, OUT);
input IN;
output OUT;
reg in1_reg, in2_reg;
wire dummyclk;
wire in_inv1, in_inv2;
assign dummyclk = IN;
assign in_inv1 = ~IN;
always @(posedge dummyclk or posedge IN or posedge in_inv1)
   if (IN)
      in1_reg <= 1'b1;
   else if (in_inv1)
      in1_reg <= 1'b0;
   else
      in1_reg <= 1'b0;
assign in_inv2 = ~in1_reg;
always @(posedge dummyclk or posedge in1_reg or posedge
in_inv2)
   if (in1_reg)
      in2_reg <= 1'b1;
   else if (in_inv2)
      in2_reg <= 1'b0;
   else
      in2_reg <= 1'b0;
assign OUT = in2_reg;
endmodule
module pulsegen (IN, PULSEOUT);
input IN;
output PULSEOUT;
wire INDLY;
delay2FF U1 (IN, INDLY);
assign PULSEOUT = IN ^ INDLY;
endmodule
```

As illustrated in Table 1, modules pulsegen and delay2FF are defined. Module delay2FF contains HDL code defining two flip-flops combined in such a way that given an input signal, an output signal is generated. Module pulsegen instantiates module delay2FF and creates a PULSEOUT signal from the input signal and the output signal. One skilled in the art would appreciate that there may be alternative ways of coding similar functionality in an HDL and Table 1 is only an exemplary illustration.

Although D-type flip-flops are illustrated in FIG. 2, it should be appreciated that any suitable flip-flip may be used within Delay 2FF module 104. It should be further appreciated that suitable flip-flops include configuring J-K flip-flops so that the J-K flip-flops implement the functionality of D-type flip-flops. Additionally although only two flip-flops are illustrated in FIG. 2, Delay 2FF module 104 may comprise any number of flip-flops depending on the desired pulse width of the logic signal delay.

Figure 3:
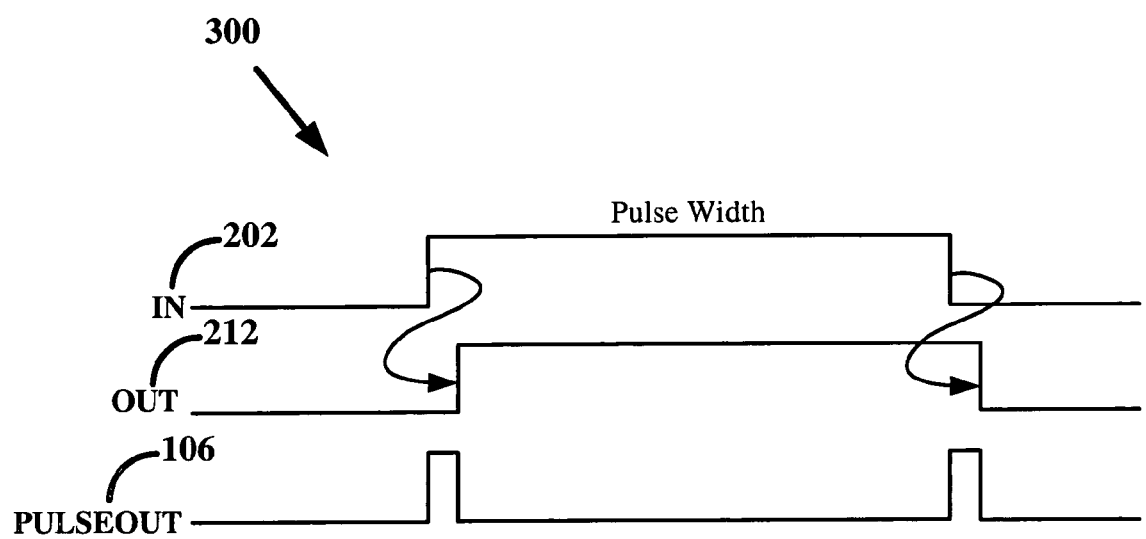
FIG. 3 is a simplified waveform diagram illustrating the signal profiles of an input signal, an output signal, and the combination of the input and output signals in accordance with one embodiment of the invention.

FIG. 3 is a simplified waveform diagram illustrating the signal profiles of an input signal, an output signal, and the combination of the input and output signals in accordance with one embodiment of the invention. As illustrated in FIG. 3, the waveform of IN signal 202 begins with a logical low signal which is followed by a period in which the signal remains logically high and thereafter returns to a logically low signal. The period in which IN signal 202 remains logically high defines the pulse width of IN signal 202.

Still Referring to FIG. 3, OUT signal 212 is the product of IN signal 202 passing through the flip-flop combination of Delay 2FF module 104 of FIG. 1. The waveform of OUT signal 212 differs from the waveform of IN signal 202 by the time taken by the flip-flop combination of Delay 2FF module 104 to create OUT signal 212. Since IN signal 202 and OUT signal 212 differ by a discrete time delay, one can create a logical signal delay by combining the rising and falling edges of IN signal 202 and OUT signal 212. The waveform of PULSEOUT signal 106 illustrates the combination of IN signal 202 and OUT signal 212 in this manner. The pulse width of PULSEOUT signal 106 reflects the time delay taken by the flip-flop combination of Delay 2FF module 104 of FIG. 1 to create OUT signal 212. Therefore, if it is desirable to increase the pulse width of PULSEOUT signal 106, additional flip-flops may be combined within Delay 2FF module 104 of FIG. 1.

It should be appreciated that flip-flops are generic circuit elements provided by a synthesis library. Accordingly, the time delay associated with IN signal 202 passing through the flip-flop combination of Delay 2FF module 104 is also a consequence of the synthesis library's signal delay times through logic gates. Therefore, if a second synthesis library which has a different delay through logic gates is used to synthesize the circuit design, the time delay of PULSEOUT signal 106 will automatically adjust for the different delay through logic gates. Automatic adjustment of signal delay times however, does not occur when logic delay gates are used to generate a logic delay signal. Logic delay gates are tied to a synthesis library and are in essence hard coded to the underlying fabrication process technology of the synthesis library. Therefore, whenever a circuit design incorporating logic delay gates is resynthesized with a synthesis library of another fabrication process technology, the logic signal delays of the circuit have to be redesigned.

Figure 4:
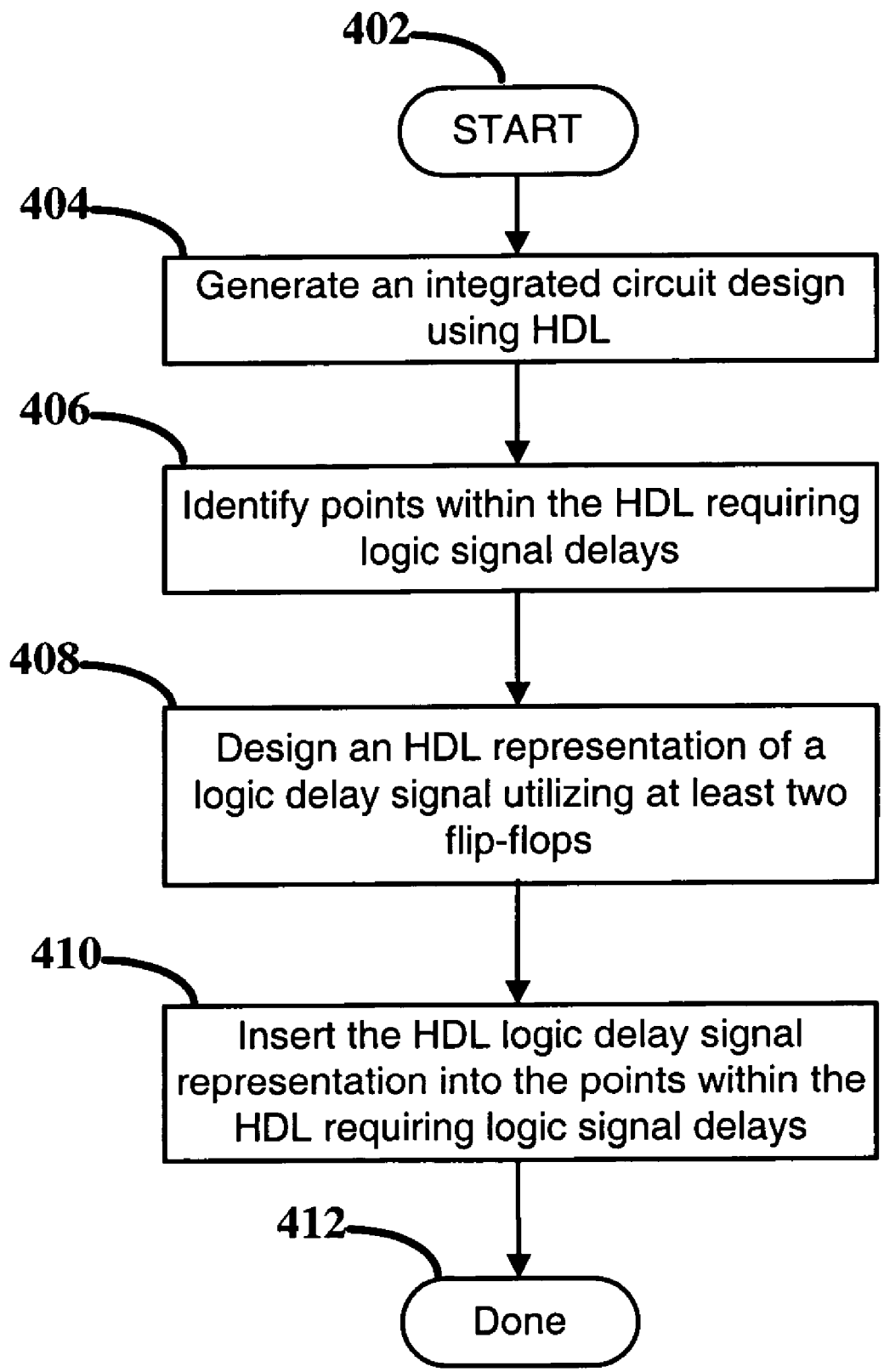
FIG. 4 is a flowchart illustrating the method operations of generating an integrated circuit having signal delays transferable across two synthesis libraries in accordance with one embodiment of the invention.

FIG. 4 is a flowchart illustrating the method operations of generating an integrated circuit having signal delays transferable across two synthesis libraries in accordance with one embodiment of the invention. In operation 402 the process of designing an integrated circuit begins. This can include preliminary circuit design activities apparent to those skilled in the art. In operation 404 an integrated circuit design is generated using HDL after which operation 406 proceeds. In operation 406, points within the HDL requiring logic signal delays are identified. Included in this operation are the operations inherent in identifying logic signal delay requirements of the circuit design such as pulse width size. Furthermore, the points may be identified from timing analysis being conducted on the integrated circuit design or other methods employed by those skilled in the art.

Still referring to FIG. 4, in operation 408 an HDL representation of a delay signal is designed to meet the logical signal delays requirements of the integrated circuit design. The HDL representation of the delay signal utilizes at least two flip-flops to create the logic delay signal. An exemplary illustration of an HDL representation of a delay signal utilizing at least two flip-flops is presented in Table 1. Operation 410 then proceeds with the HDL logic delay signal representation created in operation 408 being placed into the HDL at the points identified in operation 406. It should be appreciated that although operation 408 precedes operation 410 in FIG. 4, situations can occur in which the HDL design of operation 408 may be saved and reused for other circuit designs. Therefore, in those situations it is unnecessary to perform operation 408 before proceeding with operation 410. Once operation 410 is accomplished the process of generating an integrated circuit representation having signal delays transferable across two synthesis libraries is complete.

Figure 5:
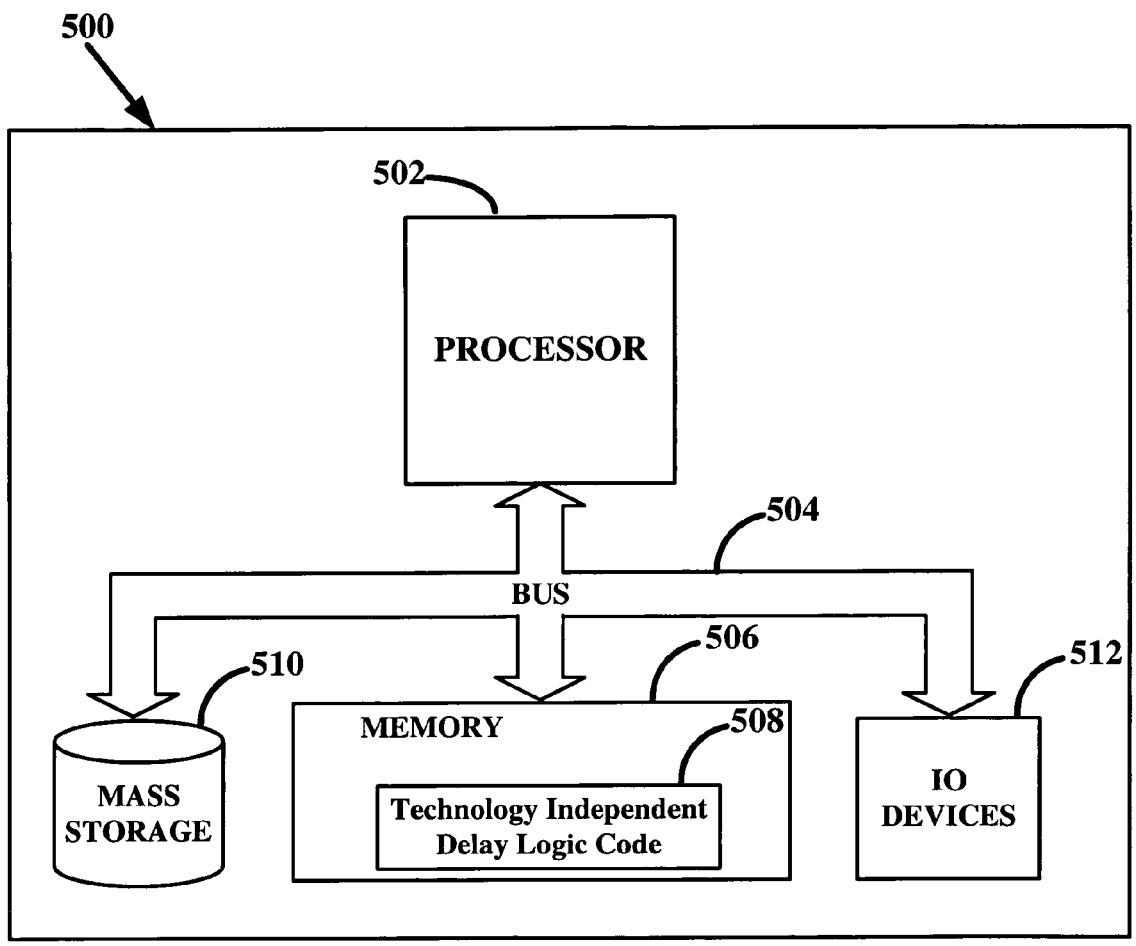
FIG. 5 is a simplified diagram of a system operable to perform the method operations of generating an integrated circuit having signal delays transferable across two synthesis libraries in accordance with one embodiment of the invention.

FIG. 5 is a simplified diagram of a system operable to perform the method operations of generating an integrated circuit having signal delays transferable across two synthesis libraries in accordance with one embodiment of the invention. System 500 is comprised of Processor 502, Bus 504, Memory 506, Technology Independent Delay Logic Code 508, Mass Storage 510 and IO Devices 512. Processor 502 communicates with Memory 508, Mass Storage 510 and IO Devices 512 through Bus 504. IO Devices 512 can comprise one or more IO devices. Memory 506 further includes Technology Independent Delay Logic Code 508. System 500 is configured such that Processor 502 receives instructions which enable generating an IC design through an HDL representation, identifying logic signal delay points with the HDL representation, and inserting Technology Independent Delay Logic Code 508 into the delay points of the HDL representation. Technology Independent Delay Logic Code 508 conforms with the embodiments illustrated in the previous figures.

It will be obvious, however, to one skilled in the art, that the present invention may be practiced without some or all of these specific details. In other instances, well known process operations have not been described in detail in order not to unnecessarily obscure the present invention.

Embodiments of the present invention may be practiced with various computer system configurations including handheld devices, microprocessor systems, microprocessor-based or programmable consumer electronics, minicomputers, mainframe computers and the like. The invention can also be practiced in distributed computing environments where tasks are performed by remote processing devices that are linked through a wire-based or wireless network.

With the above embodiments in mind, it should be understood that the invention can employ various computer-implemented operations involving data stored in computer systems. These operations are those requiring physical manipulation of physical quantities. Usually, though not necessarily, these quantities take the form of electrical or magnetic signals capable of being stored, transferred, combined, compared and otherwise manipulated.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data that can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed in tangible computer readable medium attached to network coupled computer systems so that the computer readable code is stored and executed in a distributed fashion.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

The invention claimed is:

1. A method for generating an integrated circuit (IC) representation having signal delays transferable across two synthesis libraries, wherein the two synthesis libraries are associated with different IC fabrication processes, comprising method operations of:

describing an IC design through a hardware description language (HDL) representation;

identifying logic signal delay points within the HDL representation; and inserting technology-independent logic signal delay code within the logic signal delay points of the HDL representation;

wherein inserting the technology-independent logic signal delay code further includes generating code that implements a first filp-flop and a second flip-flop introducing logic signal delays, the first flip-flop and the second flip-flop being positive-edge-triggered, D-type flip-flops;

generating code that combines an input signal with an output signal to form a logic signal delay;

generating code that connects D inputs of the first flip-flop and the second flip-flop to a logical value of 0;

generating code that connects the input signal to clock inputs of the first flip-flop and the second flip-flop; and generating code that connects an inverse of the input signal to an R input of the first flip-flop.

2. The method of claim 1, wherein inserting the technology-independent logic signal delay code further includes generating code that implements the first flip-flop and the second flip-flop introducing logic signal delays, the first flip-flop and the second flip-flop being J-K type flip-flops configured to implement a positive-edge-triggered, D-type flip-flops.

3. The method of claim 1, wherein the code that combines of an input signal with an output signal further includes code that combines the input signal and the output signal with an XOR gate.

4. The method of claim 1, wherein inserting the technology-independent logic signal delay code further includes generating code that combines at least one additional flip-flop in series with the first flip-flop and the second flip-flop to increase pulse width of the technology-independent logic signal delay.

5. The method of claim 1, wherein each step of the method operations are embodied as program instructions on a computer readable medium.

6. The method of claim 1, wherein inserting the technology-independent logic signal delay code further includes,
   generating code that connects the input signal to an S input of the first flip-flop,
   generating code that connects a Q output of the first flip-flop to an S input of the second flip-flop, and
   generating code that connects a Q output of the first flip-flop to an R input of the second flip-flop through an inverter,
   wherein a Q output of the second flip-flop produces the output signal.

7. A system for designing an integrated circuit (IC), comprising:
   a bus;
   a memory;
   a processor in communication with the memory, through the bus, the processor operable to receive instructions which, when executed by the processor, cause the processor to perform a method comprising;
   generating an IC design through an HDL representation;
   identifying logic signal delay points within the HDL representation; and
   inserting a technology-independent logic signal delay code within the logic signal delay points of the HDL representation;
   wherein inserting the technology-independent logic signal delay code further includes;
   generating code that implements a first flip-flop and a second flip-flop introducing logic signal delays, the first flip-flop and the second flip-flop being positive-edge-triggered, D-type flip-flops;
   generating code that combines an input signal with an output signal to form a logic signal delay;
   generating code that connects D inputs of the first flip-flop and the second flip-flop to a logical value of 0;
   generating code that connects the input signal to clock inputs of the first flip-flop and the second flip-flop; and
   generating code that connects an inverse of the input signal to an R input of the first flip-flop.

8. The system for designing an IC of claim 7, wherein a mass storage and at least one IO device are in communication with the processor through the bus.

9. The system for designing an IC of claim 7, wherein inserting the technology-independent logic signal delay code further includes generating code that implements the first flip-flop and the second flip-flop introducing logic signal delays, the first flip-flop and the second flip-flop being J-K type flip-flops configured to implement positive-edge-triggered, D-type flip-flops.

10. The method of claim 7, wherein the code that combines an input signal with an output signal further includes code that combines the input signal and the output signal with an XOR gate.

11. The system for designing an IC of claim 7, wherein inserting the technology-independent logic signal delay code further includes generating code that combines at least one additional flip-flop in series with the first flip-flop and the second flip-flop to increase a pulse width of the technology-independent logic signal delay.

* * * * *

UNITED STATES PATENT AND TRADEMARK OFFICE
CERTIFICATE OF CORRECTION

PATENT NO. : 7,464,353 B2
APPLICATION NO. : 11/293000
DATED : December 9, 2008
INVENTOR(S) : Ricardo Te Lim It is certified that error appears in the above-identified patent and that said Letters Patent is hereby corrected as shown below:

Column 6,
Line 46, please change "includes generating" to --includes: generating--.

Signed and Sealed this

Seventh Day of April, 2009

JOHN DOLL
*Acting Director of the United States Patent and Trademark Office*